US006452313B2

United States Patent
Watanabe et al.

(10) Patent No.: US 6,452,313 B2
(45) Date of Patent: Sep. 17, 2002

(54) MULTILAYER PIEZOELECTRIC TRANSFORMER

(75) Inventors: Yoshiyuki Watanabe; Hiroshi Kishi; Yasuyuki Inomata; Shigeo Ishii, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/823,552

(22) Filed: Mar. 30, 2001

(30) Foreign Application Priority Data

Mar. 30, 2000 (JP) ........................................ 2000-095798

(51) Int. Cl.[7] ..................... H01L 41/047; H01L 41/083; H01L 41/107
(52) U.S. Cl. ........................................ 310/366; 310/359
(58) Field of Search .................................. 310/359, 366

(56) References Cited

U.S. PATENT DOCUMENTS 3,489,931 A * 1/1970 Teaford ...................... 310/359
6,288,479 B1 * 9/2001 Watanabe .................... 310/359
6,346,762 B2 * 2/2002 Watanabe et al. ........... 310/328

FOREIGN PATENT DOCUMENTS

| JP | 11-330575 | * 11/1999 | ................. 310/359 |
| JP | 2000-31555 | * 1/2000 | ................. 310/359 |
| JP | 2001-94166 | * 4/2001 | ................. 310/359 |
| JP | 2001-94167 | * 4/2001 | ................. 310/359 |
| JP | 2001-156353 | * 6/2001 | ................. 310/359 |

* cited by examiner

Primary Examiner—Thomas M. Dougherty
(74) Attorney, Agent, or Firm—Katten Muchin Zavis Rosenman

(57) ABSTRACT

A piezoelectric transformer comprises one or more input parts having first internal electrodes and input terminals and an output part having second internal electrodes and output terminals. Each of the second internal electrodes has an area larger than that of each of the first internal electrodes. By such configuration, output power is increased while heat generation is suppressed and size thereof is not increased.

10 Claims, 5 Drawing Sheets

MULTILAYER PIEZOELECTRIC TRANSFORMER

FIELD OF THE INVENTION

The present invention relates to a piezoelectric transformer; and, more particularly, to a step-down type multilayer piezoelectric transformer.

DESCRIPTION OF THE PRIOR ART

Piezoelectric transformers feature smaller sizes and higher efficiencies than the conventional electromagnetic transformers. For such reasons, the piezoelectric transformers are gaining popularity as step-up transformers employed in, e.g., backlight power sources of liquid crystal display (LCD) monitors. However, in power supplies, step-down piezoelectric transformers are more frequently used than step-up transformers.

Voltage transformation by the piezoelectric transformer is performed as follows. First, an electrical input signal is applied to an input part of the piezoelectric transformer. Next, the electrical input signal is transformed into the mechanical vibration at the input part of the piezoelectric transformer and the mechanical vibration is propagated to an output part thereof. Then, the mechanical vibration is changed into an electrical output signal at the output part of the piezoelectric transformer.

It is preferable that a piezoelectric transformer have such characteristics as high output power, less heat generation, small size and high efficiency. The output power of a piezoelectric transformer is dictated by the velocity of the mechanical vibration. In order to generate a high vibration velocity, the input part of the piezoelectric transformer need be driven to effect a large strain. This can be accomplished by increasing interface areas between the piezoelectric material and the electrodes, e.g., by arranging the electrodes and the piezoelectric material to form a laminated structure or increasing the areas of the electrodes.

However, when the piezoelectric transformer is driven to effect a large strain, heat generation is increased due to crystallographic and electrical losses and the output power is decreased by the generated heat. Most of the heat is generated from the input part of the piezoelectric transformer. Therefore, when the input part is under restricted conditions due to heat generation, the transformation efficiency of the output part has relatively greater effects on the electrical characteristics, e.g., the output power, of the piezoelectric transformer. For such reasons, in order to produce a high output power without increasing heat generation, the mechanical vibration generated in the input part need be efficiently transformed into electrical signals at the output part.

The output power P of the piezoelectric transformer is represented as follows:

$$P \propto \frac{k^2}{1-k^2} \cdot V \cdot v^2$$

where k is an electromechanical coupling coefficient of the output part of the piezoelectric transformer, v is the velocity of the mechanical vibration and V is the volume of the output part. Therefore, the output power of the piezoelectric transformer can be enhanced by increasing the volume of the output part thereof. However, there is an upper limit for the volume of the output part which can be activated by the given amount of the vibration energy supplied from the input part. Further, the size of the piezoelectric transformer becomes larger by increasing the volume of the output part, which is not desirable.

THE SUMMARY OF THE INVENTION

It is, therefore, a primary object of the present invention to provide a piezoelectric transformer having a laminated structure and capable of producing a higher output power without increasing heat generation and the device size thereof.

In accordance with a preferred embodiment of the present invention, there is provided a piezoelectric transformer having a laminated structure, comprising one or more input parts including first internal electrodes and input terminals, and an output part including second internal electrodes and output terminals, wherein each of the second internal electrodes has an area larger than that of each of the first internal electrodes.

In accordance with another preferred embodiment of the present invention, there is provided a piezoelectric transformer having a laminated structure, comprising a laminated body including one or more input parts and an output part, the input parts being formed by laminating a plurality of first piezoelectric sheets and having first internal electrodes each of which is formed on each of the first piezoelectric sheets and input terminals for the first internal electrodes which are alternately exposed to opposite sides of the laminated body, the output part being formed by laminating a plurality of second piezoelectric sheets and having second internal electrodes each of which is formed on each of the second piezoelectric sheets and output terminals for the second internal electrodes which are alternately exposed to another opposite sides of the laminated body, and external electrodes which are electrically connected to the input terminals and the output terminals.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A first preferred embodiment in accordance with the present invention will now be described with reference to FIGS. 1 to 3.

Figure 1:
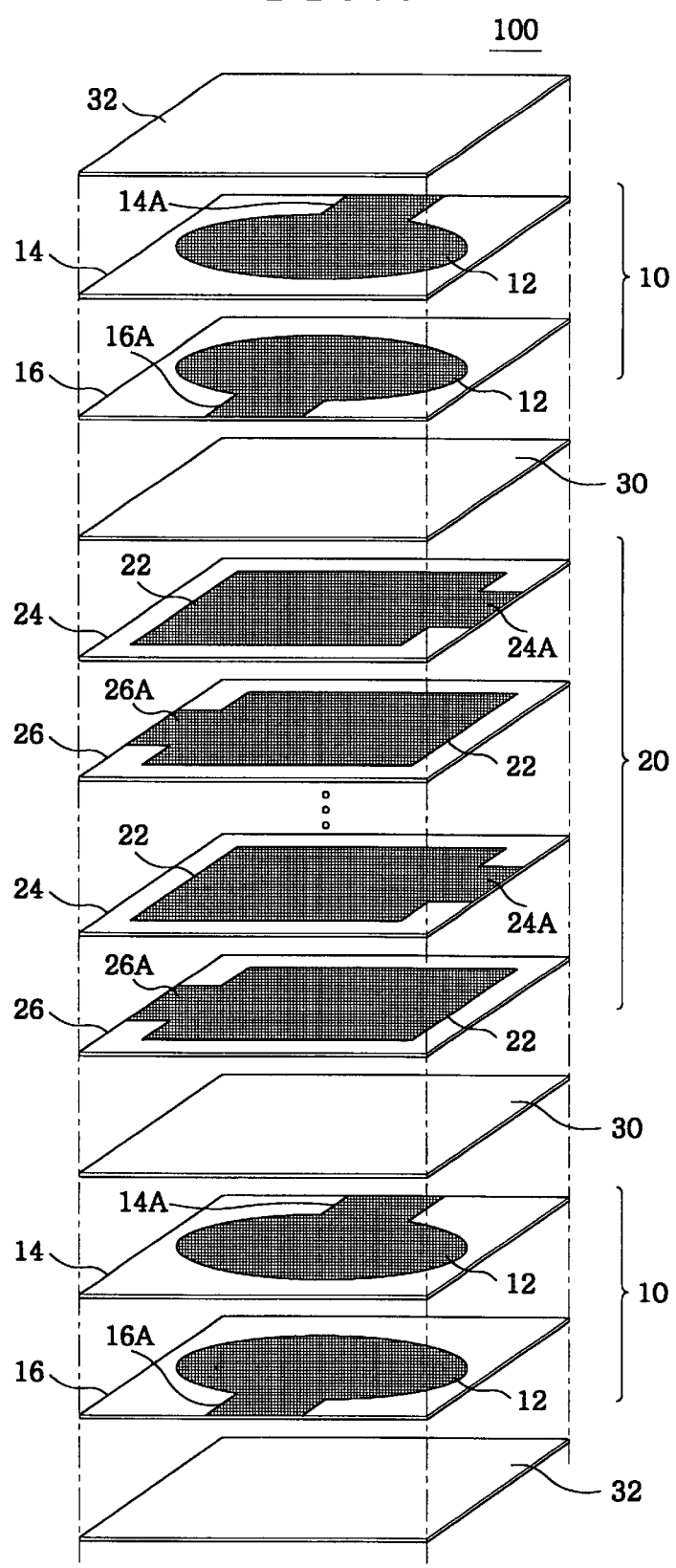
FIG. 1 shows a laminated structure of a piezoelectric transformer in accordance with a first preferred embodiment of the present invention.

FIG. 1 shows a laminated structure of a piezoelectric transformer in accordance with the first preferred embodiment of the present invention having an output part (secondary side) 20 located between two input parts 10 (primary sides). Each of the input parts 10 is formed by laminating two sheets, i.e., an upper sheet 14 and a lower sheet 16, made of a piezoelectric material. Each sheet has a round-shaped internal electrode 12 in a substantially center portion thereof. As shown in FIG. 1, there is formed at the internal electrode 12 of the upper sheet 14 a terminal portion 14A extended to a rear edge of the sheet 14. Further, at the internal electrode 12 of the lower sheet 16, a terminal portion 16A is extended to a front edge of the sheet 16. Namely, the internal electrode 12 for each input part 10 is extended in either front or rear direction through the terminal portion 14A or 16A.

The output part 20 is provided by laminating first sheets 24 and second sheets 26 alternately. Each sheet is made of a piezoelectric material and has a rectangular-shaped internal electrode 22 in a center portion thereof. For instance, six pairs of the first and the second sheets, i.e., twelve sheets in total, may be laminated to form the output part. As shown in FIG. 1, there is formed at the internal electrode 22 of the first sheet 24 a terminal portion 24A extended to a right edge of the sheet 24. Further, at the internal electrode 22 of the second sheet 26, a terminal portion 26A is extended to a left edge of the sheet 26. That is, the internal electrode 22 of the output part 20 is extended in either right or left direction through the terminal portion 24A or 26A.

Insulating sheets 30 are provided between each input part 10 and the output part 20 in order to separate the former from the latter as shown in FIG. 1. Further, protective sheets 32 are provided as an uppermost layer and a lowermost layer of the piezoelectric transformer.

Figure 2A:
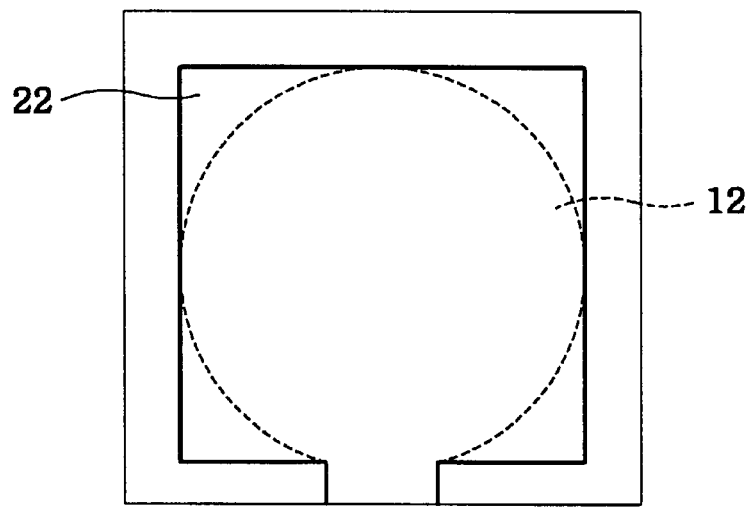
FIG. 2A provides a comparative view depicting the differences between the internal electrodes of the input part and the output part of the piezoelectric transformer in accordance with the first preferred embodiment.

Comparing the configuration of the internal electrode 12 of the input part 10 with that of the internal electrode 22 of the output part 20, the former has a smaller area than the latter, as shown in FIG. 2A.

Figure 2B:
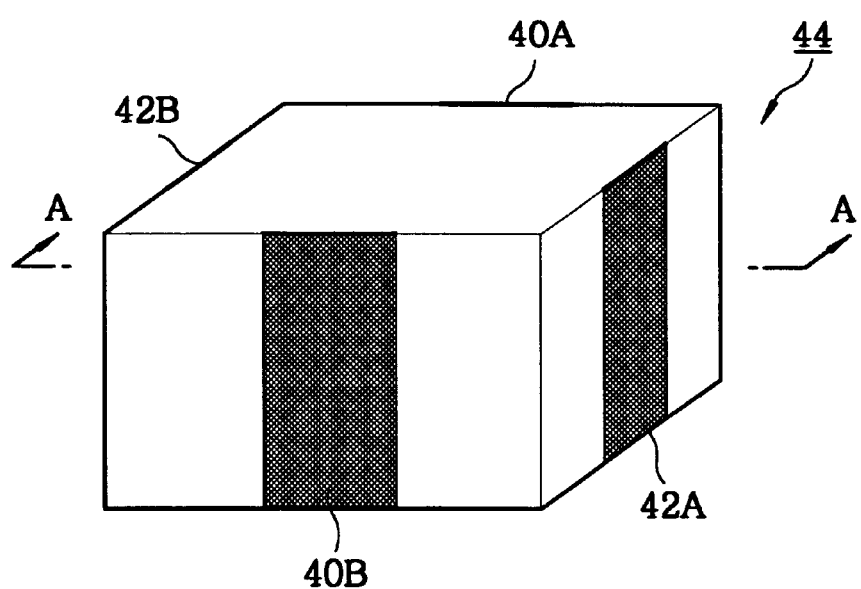
FIG. 2B sets forth a perspective view of the piezoelectric transformer in accordance with the first preferred embodiment.
Figure 2C:
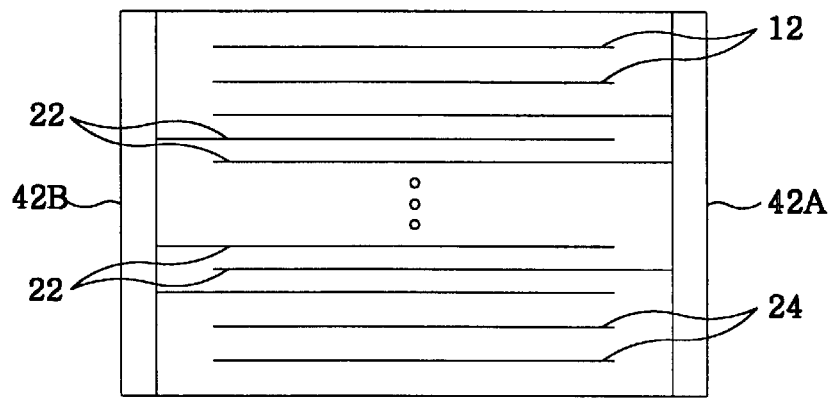
FIG. 2C presents a cross-sectional view taken on line A—A of FIG. 2B.

All the sheets are compressed after being stacked as shown in FIG. 1, thereby forming a laminated body. Thereafter, a binder removing process and a sintering process are performed and then external electrodes are formed on the laminated body as shown in FIG. 2B. In the present embodiment, the terminal portions 14A of the input parts 10 are connected to an external electrode 40A and the terminal portions 16A thereof are connected to an external electrode 40B. Further, the terminal portions 24A of the output part 20 are connected to an external electrode 42A and the terminal portions 26A thereof are connected to an external electrode 42B. The external electrodes 40A, 40B, 42A and 42B are made of a conductive material such as silver (Ag). Next, a poling process for the piezoelectric material included in the laminated body is performed through the use of the external electrodes. For example, the poling process may be performed by applying an electric field of 2 kV/mm between the external electrodes 40A and 40B and between the external electrodes 42A and 42B at 150° C. for 10 minutes. As a result, the piezoelectric transformer is obtained.

The characteristics of the piezoelectric transformer in accordance with the present embodiment are compared with those of a comparative piezoelectric transformer which has an identical configuration with the present embodiment except that each internal electrode of the output part has a same shape and a same area as those of each internal electrode of the input part.

Figure 3:
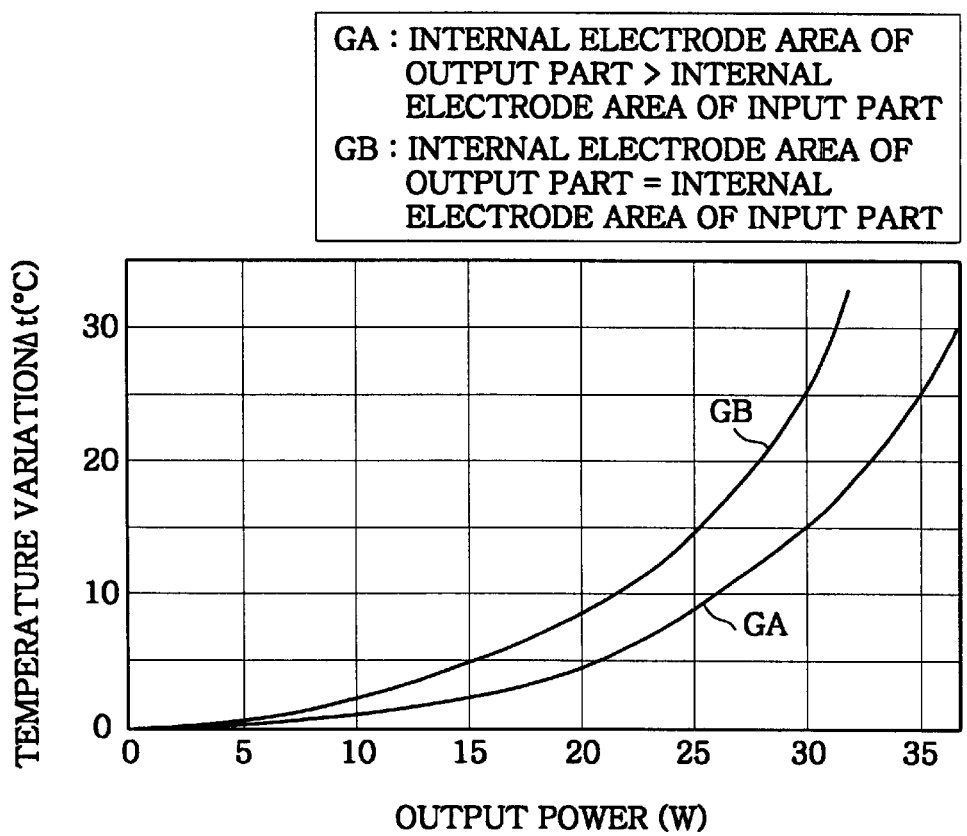
FIG. 3 describes a graph representing the dependency of a temperature variation on corresponding output powers of the piezoelectric transformer in accordance with the present invention and a comparative piezoelectric transformer.

FIG. 3 is a graph illustrating the relationship between temperature variations and output powers of the piezoelectric transformer, wherein the piezoelectric transformer in accordance with the present embodiment is represented by a curve GA and the comparative piezoelectric transformer is represented by a curve GB. The horizontal and the vertical axes of the graph indicate the output power (W) and the temperature variation (° C.), respectively. The output power is adjusted by, e.g., changing the input power and the temperature variations are measured from the surfaces of the piezoelectric transformers. As shown in FIG. 3, when the temperature variations of both piezoelectric transformers are the same, the piezoelectric transformer in accordance with the present embodiment has a larger output power than the comparative piezoelectric transformer. For example, at the temperature variation of 25° C., the output power of the former is 35 W and that of the latter is 30 W.

As shown above, since the input part of the piezoelectric transformer in accordance with the present embodiment includes the input parts which have the same configurations as those of the comparative piezoelectric transformer, the amount of heat generation in the former is substantially identical with that of the latter. Further, the sizes of the piezoelectric sheets and the numbers of the layers included in the former are same as those included in the latter and, therefore, the device size of the former is substantially identical with that of the latter. However, the output part of the former includes the internal electrodes having a larger area than those of the input parts and, therefore, the volume of the output part increases effectively. Accordingly, the mechanical vibration may be efficiently converted into the electric power and the output power may be increased without generating heat and increasing the device size.

A second preferred embodiment in accordance with the present invention will now be described with reference to FIGS. 4 and 5. Like reference numerals used in the first and the second preferred embodiments refer to the like elements.

Figure 4:
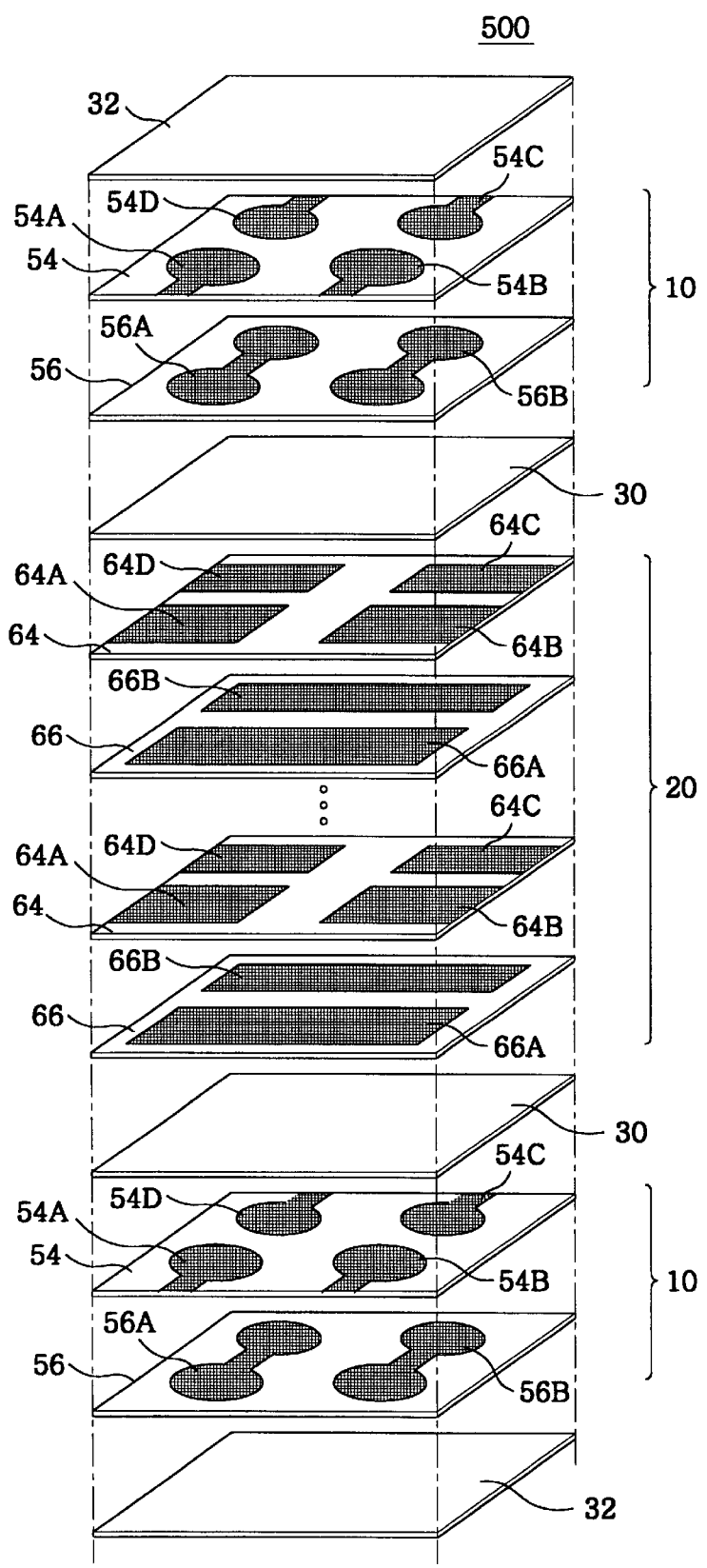
FIG. 4 depicts a laminated structure of a piezoelectric transformer in accordance with a second preferred embodiment of the present invention.

FIG. 4 presents a laminated structure of a piezoelectric transformer in accordance with the second preferred embodiment of the present invention.

As shown in FIG. 4, disjointed internal electrodes 54A to 54D, each having a round shape, are formed on an upper sheet 54 of each input part 10. The electrodes 54A and 54B are exposed at a front edge of the upper sheet 54 and the electrodes 54C and 54D are exposed at a rear edge of the upper sheet 54. Further, an internal electrode 56A is formed on a lower sheet 56 such that the internal electrode 56A overlaps with the areas of the internal electrodes 54A and 54D on the upper sheet when viewed from top. On the lower sheet 56 of each input part 10, there is also formed an internal electrode 56B such that the internal electrode 56B overlaps with the areas of the internal electrodes 54B and 54C on the upper sheet when viewed from top.

Meanwhile, rectangular-shaped internal electrodes 64A to 64D are formed separately on a first sheet 64 in the output part 20 such that two electrodes 64B and 64C are exposed at the right edge of the first sheet 64 and the remaining electrodes are exposed at the left edge of the first sheet 64. Further, a rectangular-shaped internal electrode 66A is formed on a second sheet 66 such that the internal electrode 66A overlaps with portions of the areas of the internal electrodes 64A and 64B when viewed from top. A rectangular-shaped internal electrode 66B is also formed on the second sheet 66 such that the internal electrode 66B overlaps with portions of the areas of the internal electrodes 64C and 64D.

Insulating sheets 30 are provided between the input part 10 and the output part 20 to separate the former from the latter as shown in FIG. 1. Further, protective sheets 32 are provided as an uppermost layer and a lowermost layer of the piezoelectric transformer as shown in FIG. 4.

Figure 5A:
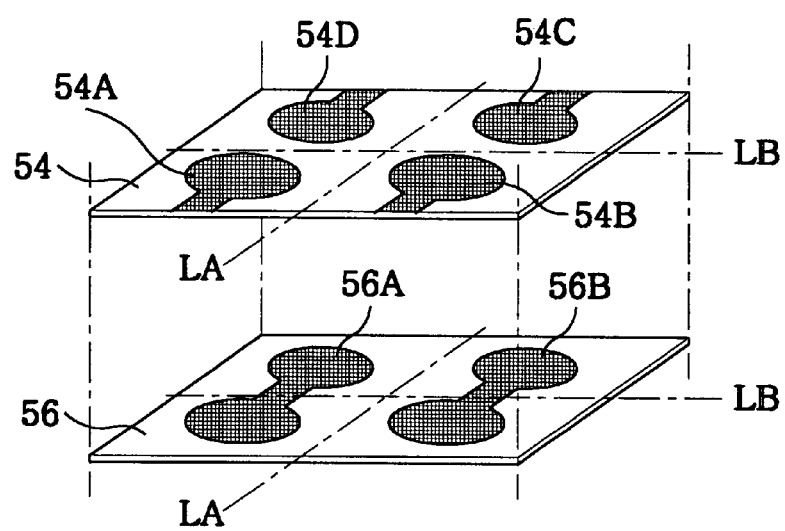
FIGS. 5A and 5B illustrate dicing configurations of the piezoelectric transformer in accordance with the second preferred embodiment of the present invention.
Figure 5B:
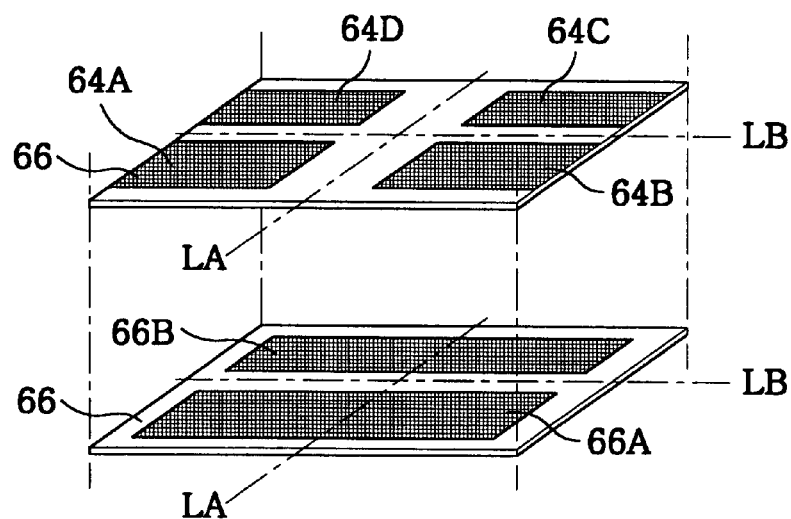

All the sheets are stacked as shown in FIG. 4 and compressed to thereby form a stacked body. The stacked body is diced into four parts as illustrated in FIGS. 5A and 5B, thereby forming four laminated bodies. The input part 10 is diced along lines LA and LB as shown in FIG. 5A and the internal electrodes 56A and 56B are thereby exposed at diced edges thereof. Further, the output part 20 is diced along lines LA and LB as shown in FIG. 5B and the internal electrodes 66A and 66B are thereby exposed at diced edges thereof. After dicing, a binder removing process and a sintering process are performed and then external electrodes are formed on the laminated body in a similar way as illustrated in FIG. 2, thereby obtaining the piezoelectric transformer.

The piezoelectric transformer in accordance with the second preferred embodiment brings about the same effects as that of the first preferred embodiment although the shape of the internal electrodes and extending directions from the internal electrodes thereof are different from those of the piezoelectric transformer of the first embodiment.

Since the output part of the piezoelectric transformer in accordance with the present invention includes the internal electrodes having larger areas than those of the input part, the output power can be increased while heat generation is suppressed and the size thereof is not increased.

It is to be appreciated that the shapes of piezoelectric sheets or the electrodes, the locations of external electrodes on a laminated body and the number of piezoelectric sheets may be varied appropriately if necessary. Further, various known materials may be used as the piezoelectric material or electrode material.

Since the piezoelectric transformer in accordance with the present invention can produce a large output power, the piezoelectric transformer of the present invention may be preferably used as a step-up transformer. However, the present invention may also be applied in fabricating step-down transformers as well.

While the present invention has been described with respect to the particular embodiments, it will be apparent to those skilled in the art that various changes and modifications may be made without departing from the spirit and scope of the invention as defined in the following claims.

What is claimed is:

1. A piezoelectric transformer of a laminated structure, comprising:

one or more input parts having first internal electrodes and input terminals; and an output part having second internal electrodes and output terminals, wherein each of the second internal electrodes has an area larger than that of each of the first internal electrodes.

2. The piezoelectric transformer of claim 1, wherein an input voltage is higher than an output voltage.

3. The piezoelectric transformer of claim 1, wherein the input parts are formed by laminating a plurality of first piezoelectric sheets, the input parts having first internal electrodes each of which is formed on each of the first piezoelectric sheets and input terminals for the first internal electrodes which are alternately exposed to opposite side of the laminated body, and the output part is formed by laminating a plurality of second piezoelectric sheets, the output part having second internal electrodes each of which is formed on each of the second piezoelectric sheets and output terminals for the second internal electrodes which are alternately exposed to another opposite sides of the laminated body.

4. The piezoelectric transformer of claim 3, wherein an input voltage is higher than an output voltage.

5. The piezoelectric transformer of claim 3, wherein the output part is disposed between the input parts.

6. The piezoelectric transformer of claim 3, wherein the number of the second piezoelectric sheets is larger than that of the first piezoelectric sheets.

7. The piezoelectric transformer of claim 3, further comprising external electrodes being electrically connected to the input terminals and the output terminals.

8. The piezoelectric transformer of claim 3, wherein each of the first internal electrodes has a generally circular shape.

9. The piezoelectric transformer of claim 3, wherein each of the second internal electrodes has a generally rectangular shape.

10. The piezoelectric transformer of claim 3, wherein each of the first and the second ceramic sheets has a generally rectangular shape.

* * * * *